(12) United States Patent
Sakuma et al.

(10) Patent No.: US 11,887,956 B2
(45) Date of Patent: Jan. 30, 2024

(54) TEMPERATURE HIERARCHY SOLDER BONDING

(71) Applicant: International Business Machines Corporation, Armonk, NY (US)

(72) Inventors: Katsuyuki Sakuma, Fishkill, NY (US); Mukta Ghate Farooq, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 17/555,987

(22) Filed: Dec. 20, 2021

(65) Prior Publication Data

US 2023/0197657 A1 Jun. 22, 2023

(51) Int. Cl.
*H01L 23/00* (2006.01)

(52) U.S. Cl.
CPC .............. *H01L 24/13* (2013.01); *H01L 24/05* (2013.01); *H01L 24/16* (2013.01); *H01L 24/81* (2013.01); *H01L 2224/05644* (2013.01); *H01L 2224/05647* (2013.01); *H01L 2224/05655* (2013.01); *H01L 2224/05664* (2013.01); *H01L 2224/1308* (2013.01); *H01L 2224/13144* (2013.01); *H01L 2224/13147* (2013.01); *H01L 2224/13155* (2013.01); *H01L 2224/13164* (2013.01); *H01L 2224/1601* (2013.01); *H01L 2224/16145* (2013.01); *H01L 2224/81815* (2013.01)

(58) Field of Classification Search
CPC ......... H01L 24/13; H01L 24/05; H01L 24/16; H01L 24/81; H01L 2224/05644; H01L 2224/05647; H01L 2224/05655; H01L 2224/05664; H01L 2224/1308; H01L 2224/13144; H01L 2224/13147; H01L 2224/13155; H01L 2224/13164; H01L 2224/1601; H01L 2224/16145; H01L 2224/81815

See application file for complete search history.

(56) References Cited

U.S. PATENT DOCUMENTS

| 5,598,036 | A | 1/1997 | Ho |
| 5,655,703 | A | 8/1997 | Jimarez |
| 6,433,425 | B1* | 8/2002 | Sarkhel ................. H01L 23/488 257/737 |
| 6,854,636 | B2 | 2/2005 | Farooq |

(Continued)

OTHER PUBLICATIONS

"Method for a material to maintain a lead-free reflow temperature hierarchy for surface mounting pins, connectors, and other SMT components," An IP.com Prior Art Database Technical Disclosure, Authors et. al.: Disclosed Anonymously, IP.com No. IPCOM000007949D, IP.com Electronic Publication Date: May 7, 2002, 3 pages.

(Continued)

*Primary Examiner* — Douglas W Owens
(74) *Attorney, Agent, or Firm* — Aaron N. Pontikos

(57) ABSTRACT

A semiconductor device and formation thereof. The semiconductor device includes a first semiconductor structure, a second semiconductor structure, and a plurality of pillars interconnecting the first semiconductor structure and the second semiconductor structure. The plurality of pillars include a first solder layer and a second solder layer, wherein the first solder layer has a higher melting point than the second solder layer.

19 Claims, 13 Drawing Sheets

(56) References Cited

U.S. PATENT DOCUMENTS

| | | | |
|---|---|---|---|
| 7,838,954 B2 * | 11/2010 | Buchwalter | B23K 1/19 |
| | | | 257/E33.033 |
| 9,105,629 B2 | 8/2015 | Interrante | |
| 9,607,973 B1 * | 3/2017 | Fasano | H01L 24/16 |
| 10,002,835 B2 | 6/2018 | Fasano | |
| 11,640,947 B2 * | 5/2023 | Mao | C09D 179/04 |
| | | | 257/738 |
| 11,640,958 B2 * | 5/2023 | Chen | H01L 24/09 |
| | | | 257/668 |
| 2005/0199996 A1 | 9/2005 | Ho | |

OTHER PUBLICATIONS

Choi et al., "Development of Novel Intermetallic Joints using Thin Film Indium Based Solder by Low Temperature Bonding Technology for 3D IC Stacking," 2009 Electronic Components and Technology Conference, pp. 333-338, doi: 10.1109/ECTC.2009.5074036.

* cited by examiner

TEMPERATURE HIERARCHY SOLDER BONDING

BACKGROUND OF THE INVENTION

The present invention relates generally to the field of integrated circuits, and more particularly to low temperature solder bonding of flip chips using a temperature hierarchy.

Flip chip, also known as controlled collapse chip connection (C4), is a method for interconnecting dies such as semiconductor devices and integrated circuit (IC) chips to external circuity with solder bumps formed on the chip pads of the top side of the die. In order to mount the die to external circuity, such as a laminate or a printed circuit board (PCP) or another die, the die is flipped over so that its top side faces down, and aligned so that its pads align with matching pads on the external circuitry. The solder is reflowed to complete the interconnect between the die and the external circuitry.

SUMMARY

According to one embodiment of the present invention, a semiconductor device is provided. The semiconductor device includes a first semiconductor structure, a second semiconductor structure, and a plurality of pillars interconnecting the first semiconductor structure and the second semiconductor structure. The plurality of pillars include a first solder layer and a second solder layer, wherein the first solder layer has a higher melting point than the second solder layer.

According to another embodiment of the present invention, a method of forming a semiconductor device is disclosed. The method includes forming a plurality of pillars on a surface of a first semiconductor structure, wherein each pillar in the plurality of pillars is formed based, at least in part, on: depositing a first metal layer onto a surface of the first semiconductor structure, depositing a first solder layer onto the first metal layer, depositing a second metal layer onto the first solder layer, and depositing a second solder layer onto the second metal layer, wherein the second solder layer has a lower melting point than a melting point of the first solder layer. The method further includes interconnecting the first semiconductor structure with the second semiconductor structure by attaching the second solder layer of each pillar in the plurality of pillars to a respective bonding pad of a plurality of bonding pads located on a surface of the second semiconductor structure.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

When viewed as ordered combinations, FIGS. 1-12 illustrate both (i) semiconductor devices and (ii) the methods for forming such semiconductor devices, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
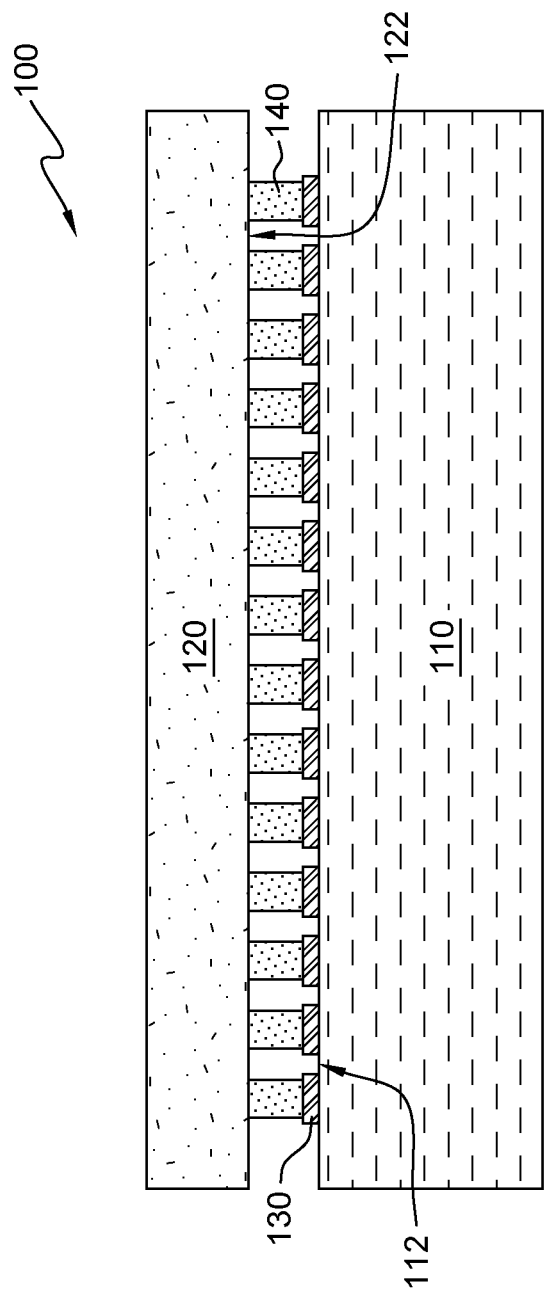
FIG. 1 illustrates a cross-sectional view of a semiconductor structure, generally designated 100, in accordance with at least one embodiment of the present invention.

The present invention relates generally to the field of integrated circuits, and more particularly to low temperature solder bonding of flip chips using a temperature hierarchy.

Chip-package interaction (CPI) has become a critical reliability issue for flip-chip packaging of copper (Cu)/low-k chips with an organic substrate. After packaging, thermo-mechanical deformations, and thereby thermal stress, can occur due to differences in the coefficients of thermal expansion (CTEs) between the chip and substrate. Thermal stress can ultimately result in mechanical reliability issues in the solder joints (e.g., solder fatigue) and the underfill layer (e.g., underfill lamination) between the die and substrate. Moreover, thermal stress as a result of package deformation can also cause interfacial crack formation and propagation of the Cu/low-k interconnect layers of the substrate.

Reflow soldering is the most widely used method of attaching surface mount components, such as semiconductor dies to a package substrate, such as a laminate and a printed circuit board (PCB). The aim of the process is to form acceptable solder joints by first pre-heating the surface mount component, PCB and solder, and then melting the solder without causing damage by overheating. By using reflow soldering technologies, it is possible to reliably solder surface mount components, and particularly those with very fine pitch leads. This makes it ideal for use with components used in mass produced electronics products.

Typically, the bonding or reflow temperature range for tin (Sn) or tin/silver (SnAg) or tin/silver/copper (SnAgCu) based solder is between 217-232° C. Embodiments of the present invention recognize that it is advantageous to use lower bonding temperature solders for attaching surface mount components to a package substrate since higher bonding temperatures may cause mechanical reliability issues in the solder joints. This stems from the fact that at a higher bonding temperature, the temperature range between room temperature and the temperature required for bonding is greater. Accordingly, when bonding a chip to a substrate having different CTEs, the amount of expansion and contraction that the bonding pads located on the laminate will endure increases as the temperature required for bonding increases. This can ultimately result in increased mechanical reliability issues, such as increased stress at the solder joint, especially as the pitch of the solder becomes finer.

Furthermore, embodiments of the present invention recognize that solder based attachment of surface mount components to a package substrate with a solder reflow temperature range between 217-232° C. or greater can decrease the integrity of the structure as a whole. This stems from the fact that at higher reflow temperatures and longer reflow time, the amount of free solder that is converted into an intermetallic compound (IMC) increases, thereby ultimately reducing the ability of the solder bump to absorb strain. The negative effect of increased reflow temperatures on the structural integrity of the chip package is even more significant with the use of fine pitch solder bumps. By nature, fine pitch solder bumps have less solder to begin with than solder bumps having broader pitch sizes. This results in a higher ratio of IMC to free solder since the amount of solder used in a fine pitch solder bump is already less to begin with. Similarly, the negative effect of increased reflow temperatures on the structural integrity of the chip package as a whole is even more pronounced if the mount surface of the package substrate is concave or convex, which results in the interconnect formed between the semiconductor die and package substrate to be subjected to increased mechanical stress. Thermal distortion of the pad position also makes fine pitch bonding more difficult.

Embodiments of the present invention improve upon the foregoing deficiencies of flip chip technologies, and the resulting structures thereof, by attaching a semiconductor die to a package substrate using two distinct metallurgical alloy compositions having different reflow temperatures. In an embodiment, a first metallurgical alloy composition having a higher reflow temperature is formed closest with respect to the surface of a semiconductor die. A second, distinct metallurgical alloy composition having a lower reflow temperature is then formed after the first metallurgical alloy composition. It should be appreciated that the use of both a lower reflow temperature solder and a higher reflow temperature solder advantageously allows for a low temperature joining process, while increasing the structural integrity of the final packaged structure.

By using a lower reflow temperature solder at the joining interface, and a higher reflow temperature solder closest to the surface of the semiconductor die, an IMC is only formed at the joining interface since the higher reflow temperature solder closest to the surface of the semiconductor die does not melt. This is advantageous in that the IMC formed at the joining interface still provides for good bonding, while the higher reflow temperature solder can better absorb strain caused by elastic and plastic deformation since none of the higher reflow temperatures solder is converted to an IMC. Thus, embodiments of the present invention provide for an improved interconnection formed between a semiconductor die and a package substrate that reduces mechanical stress of said interconnected devices and eliminates damage in under-bump-metallurgy (UBM) or BEOL structures due to chip-package-interaction (CPI) issues.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below, in conjunction with FIGS. 1-12, embodiments of the present invention include semiconductor devices and methods of forming such semiconductor devices, and in particular, interconnecting two semiconductor structures using pillar structures that include two distinct metallurgical alloy compositions having different reflow temperatures. The methods described below in conjunction with FIGS. 1-12 may be incorporated into typical semiconductor device fabrication processes. As such, when viewed as ordered combinations, FIGS. 1-12 illustrate methods for interconnecting two semiconductor structures using pillar structures including two distinct metallurgical alloy compositions having different reflow temperatures, thereby reducing mechanical stress on said semiconductor structures, and eliminating damage caused to FEOL and BEOL devices due to the use of higher reflow temperature solders.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of microcooler device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, microetching, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

The present invention will now be described in detail with reference to the Figures. FIGS. 1-12 include various cross-sectional views depicting illustrative steps of a method for manufacturing semiconductor devices and the resulting semiconductor devices according to select embodiments of the present invention. One having ordinary skill in the art will appreciate that there are many options available for the formation of the structures described herein and that the following discussion does not limit embodiments to only the techniques described herein.

Referring now to FIG. 1, FIG. 1 illustrates a cross-sectional view of a semiconductor structure, generally designated 100, in accordance with at least one embodiment of the present invention. Semiconductor structure 100 includes a substrate 110 interconnected to a semiconductor die 120. Substrate 110 can be made from any generally known substrates (e.g., a glass/ceramic substrate, an organic laminate, or printed circuit board (PCB)) that provide semiconductor die 120 with structural base support and a form of electrical interface. Substrate can be a chip, wafer, or panel of any size. In an embodiment, substrate 110 may be a semiconductor material such as, for example, silicon (Si), germanium (Ge), a silicon germanium (SiGe) alloy, a silicon carbide (SiC) alloy, a silicon germanium carbide (SiGeC) alloy, or a III/V compound semiconductor (e.g., InAs, GaAs or InP). In another embodiment, substrate 110 may be an organic multilayer laminate or PCB. In another embodiment, substrate 110 may be a dielectric material such as, for example, undoped glass or doped glass. In another embodiment, substrate may be a metal such as, for example, titanium (Ti), vanadium (V), chromium (Cr), manganese (Mn), iron (Fe), cobalt (Co), nickel (Ni), copper (Cu), molybdenum (Mo) and alloys, oxides, and nitrides thereof.

Semiconductor die 120 can be made from any generally known semiconductor materials (e.g., silicon, gallium arsenide, or germanium) and includes an integrated circuit formed thereon. As depicted in FIG. 1, semiconductor die 120 is flip chip.

A plurality of bonding pads 130, also known as contact pads, are formed on a top surface 112 of substrate 110. In an embodiment, bonding pads 130 can have a composition including, but not limited to, gold (Au), palladium (Pd), Copper (Cu), Nickel (Ni), and alloys thereof. Bonding pads are designated surface areas on a surface of one structure, such as an organic laminate and a printed circuit board (PCB), for mechanically and electrically interconnecting another structure, such as a semiconductor die. Although not depicted in the Figures, in some embodiments, wiring layers are located under bonding pads 130.

A plurality of pillars 140 are formed to interconnect substrate 110 with semiconductor die 120. A first end of pillars 140 is attached to bottom surface 122 of semiconductor die 120. A second end of pillars 140 is attached to bonding pads 130, respectively, thereby forming a mechanical and electrical interconnection between top surface 112 of substrate 110 and bottom surface 122 of semiconductor die 120. Substrate 120 further includes through vias (not depicted), which are typically used to electrically and mechanically connect wires on the top surface of substrate 120 to wires on the bottom surface of substrate 120.

Figure 2:
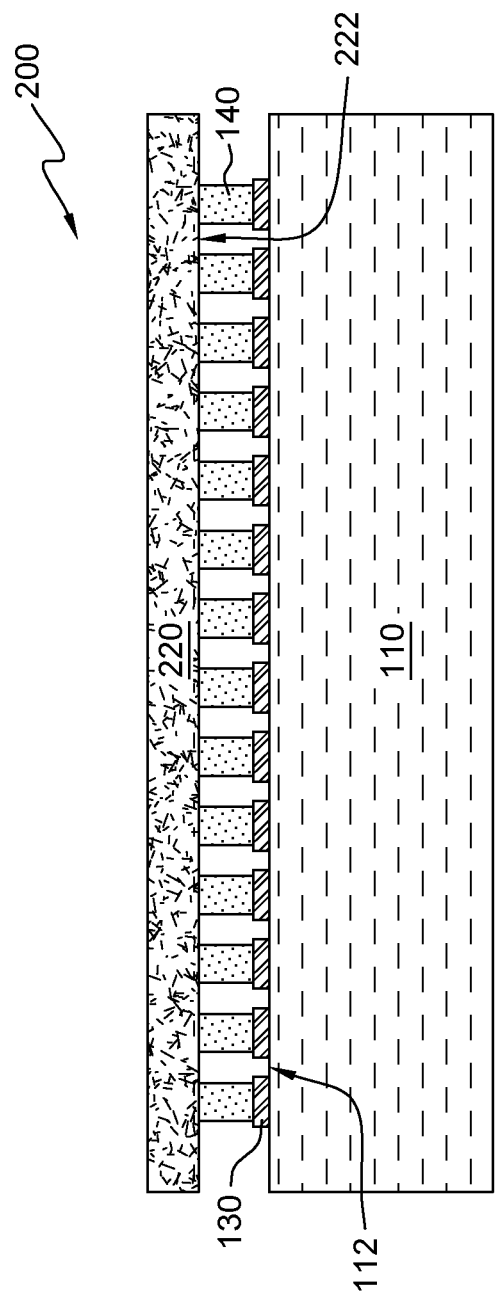
FIG. 2 illustrates a cross-sectional view of a semiconductor structure, generally designated 200, in accordance with at least one embodiment of the present invention.

FIG. 2 illustrates a cross-sectional view of a semiconductor structure, generally designated 200, in accordance with at least one embodiment of the present invention. Semiconductor structure 200 includes substrate 110 interconnected to an interposer 220. Interposer 220 can be made from any generally known interposer materials (e.g., glass, organic, or silicon based materials). In another embodiment, interposer 220 can be made from a semiconductor material, such as, but not limited to, silicon (Si), germanium (Ge), a silicon germanium (SiGe) alloy, a silicon carbide (SiC) alloy, a silicon germanium carbide (SiGeC) alloy, or a III/V compound semiconductor (e.g., InAs, GaAs or InP). In another embodiment, interposer 220 can be made from a dielectric material such as, for example, undoped glass or doped glass. In another embodiment, interposer can be made from a metal such as, for example, titanium (Ti), vanadium (V), chromium (Cr), manganese (Mn), iron (Fe), cobalt (Co), nickel (Ni), copper (Cu), molybdenum (Mo) and alloys, oxides and nitrides thereof. Interposer 220 further includes through vias (not depicted). In the case of a silicon interposer, through silicon vias (TSVs) are formed to electrically and mechanically connect the wires on the top surface of the interposer to the wires located on the bottom surface of the interposer.

Bonding pads 130 are formed on top surface 112 of substrate 110. Pillars 140 are formed to interconnect substrate 110 with interposer 220. A first end of pillars 140 is attached to bottom surface 222 of interposer 220. A second end of pillars 140 is attached to bonding pads 130, respectively, thereby forming a mechanical and electrical interconnection between top surface 112 of substrate 110 and bottom surface 222 of interposer 220.

Figure 3:
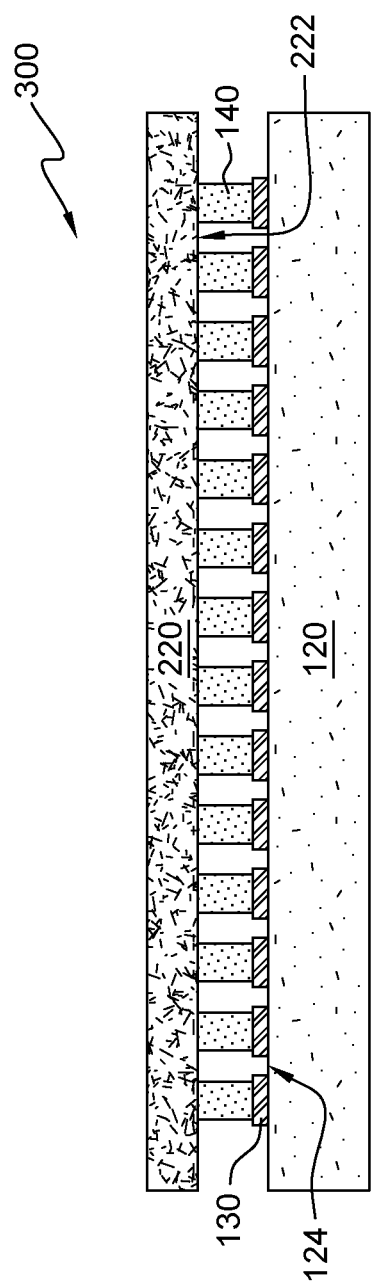
FIG. 3 illustrates a cross-sectional view of a semiconductor structure, generally designated 300, in accordance with at least one embodiment of the present invention.

FIG. 3 illustrates a cross-sectional view of a semiconductor structure, generally designated 300, in accordance with at least one embodiment of the present invention. Semiconductor structure 300 includes semiconductor die 120 interconnected to interposer 220. In an alternative embodiment, semiconductor die 120 is a semiconductor wafer. Bonding pads 130 are formed on a top surface 124 of semiconductor die 120, or in the alternative, on a top surface of a semiconductor wafer. Pillars 140 are formed to interconnect semiconductor die 120 with interposer 220. A first end of pillars 140 is attached to bottom surface 222 of interposer 220. A second end of pillars 140 is attached to bonding pads 130, respectively, thereby forming a mechanical and electrical interconnection between top surface 124 of semiconductor die 120 and bottom surface 222 of interposer 220. Semiconductor die 120, or in the alternative, the semiconductor wafer may already have TSVs formed before bonding interposer 220 to semiconductor die 120 or a semiconductor wafer.

Figure 4:
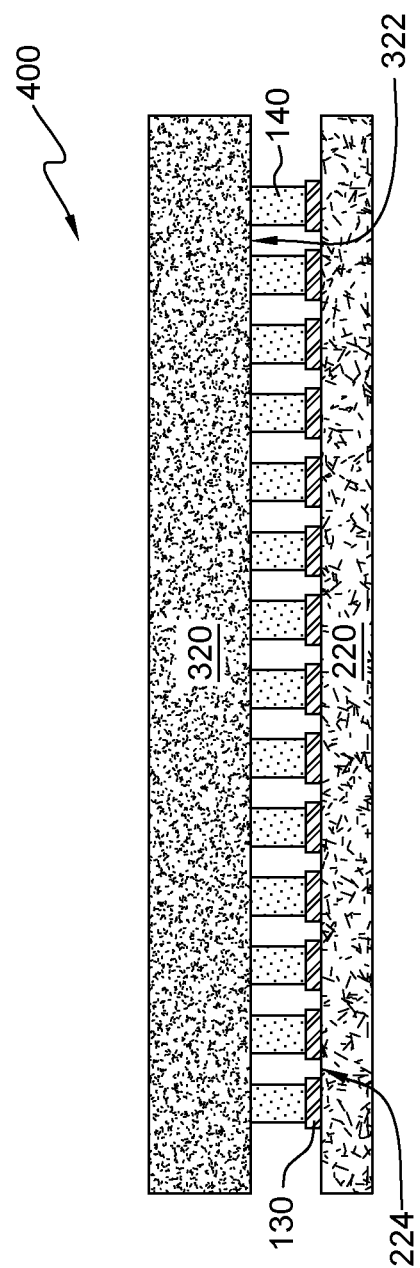
FIG. 4 illustrates a cross-sectional view of a semiconductor structure, generally designated 400, in accordance with at least one embodiment of the present invention.

FIG. 4 illustrates a cross-sectional view of a semiconductor structure, generally designated 400, in accordance with at least one embodiment of the present invention. Semiconductor structure 400 includes interposer 220 interconnected to a semiconductor die 320. In an alternative embodiment, semiconductor die 320 is a semiconductor wafer. Semiconductor die 320 can be made from any generally known semiconductor materials (e.g., silicon, gallium arsenide, or germanium) and includes an integrated circuit formed thereon. As depicted in FIG. 4, semiconductor die 320 is flip chip.

Bonding pads 130 are formed on a top surface 224 of interposer 220. Pillars 140 are formed to interconnect interposer 220 with semiconductor die 320. A first end of pillars 140 is attached to a bottom surface 322 of semiconductor die 320, or in the alternative, on a top surface of a semiconductor wafer. A second end of pillars 140 is attached to bonding pads 130, respectively, thereby forming a mechanical and electrical interconnection between top surface 224 of interposer 220 and bottom surface 322 of semiconductor die 320.

Figure 5:
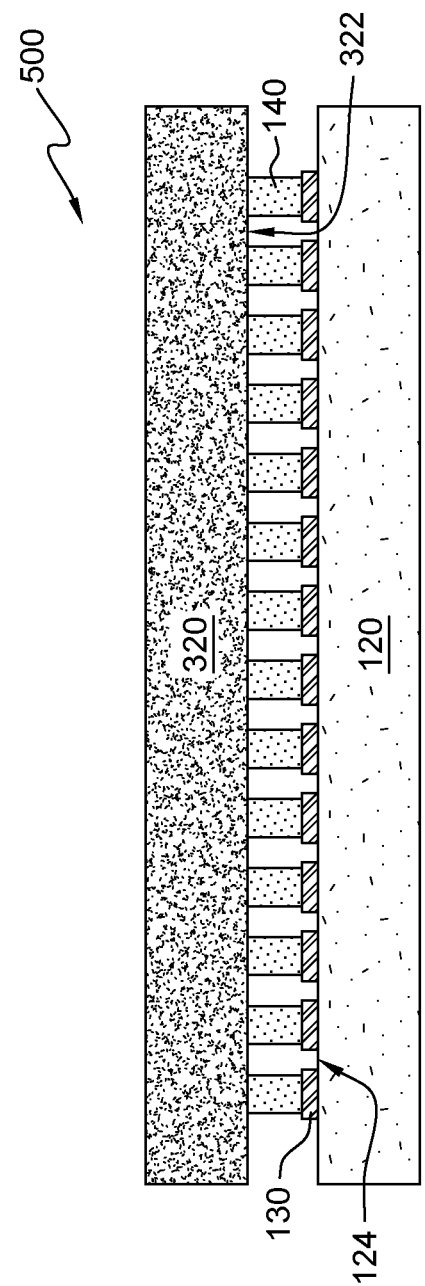
FIG. 5 illustrates a cross-sectional view of a semiconductor structure, generally designated 500, in accordance with at least one embodiment of the present invention.

FIG. 5 illustrates a cross-sectional view of a semiconductor structure, generally designated 500, in accordance with at least one embodiment of the present invention. Semiconductor structure 500 includes semiconductor die 120 interconnected to semiconductor die 320. In an alternative embodiment, semiconductor die 120 and semiconductor die 320 are semiconductor wafers. Bonding pads 130 are formed on top surface 124 of semiconductor die 120, or in the alternative, on a top surface of a semiconductor wafer. Pillars 140 are formed to interconnect semiconductor die 120 with semiconductor die 320. A first end of pillars 140 is attached to bottom surface 322 of semiconductor die 320, or in an the alternative, to a bottom surface of a semiconductor wafer. A second end of pillars 140 is attached to bonding pads 130, respectively, thereby forming a mechanical and electrical interconnection between top surface 124 of semiconductor die 120 and bottom surface 322 of semiconductor die 320.

Figure 6:
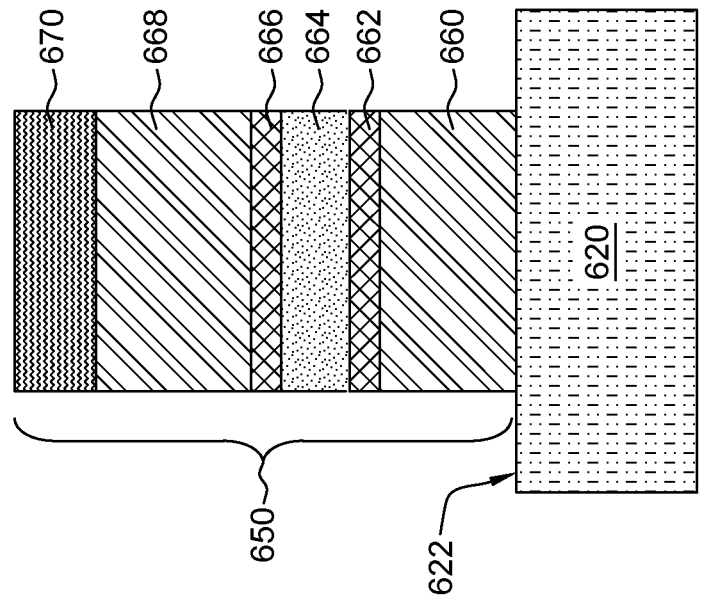
FIG. 6 illustrates material compositions formed on structures 610 and 620, respectively, for interconnecting structure 610 with structure 620 in accordance with at least one embodiment of the present invention.
Figure 6:
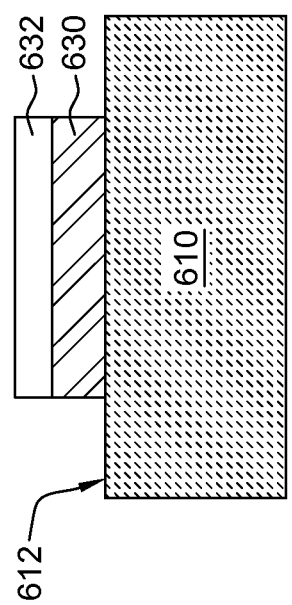
Figure 7:
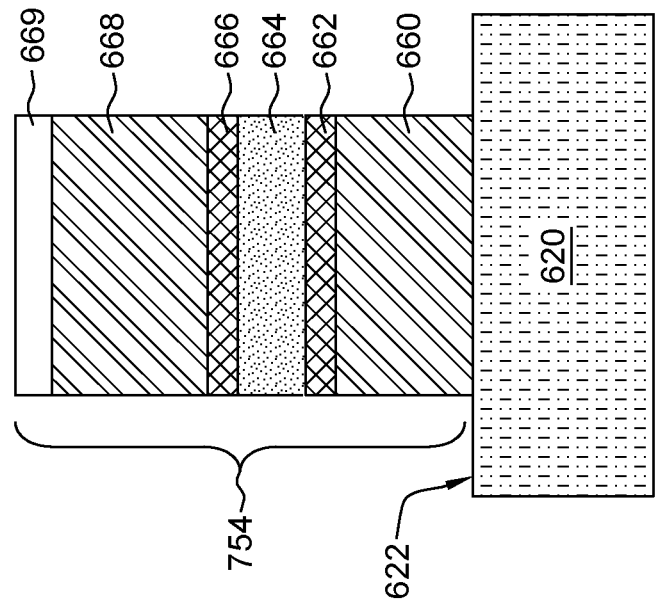
FIG. 7 illustrates alternative material compositions formed on structures 610 and 620, respectively, for interconnecting structure 610 with structure 620 in accordance with at least one embodiment of the present invention.
Figure 7:
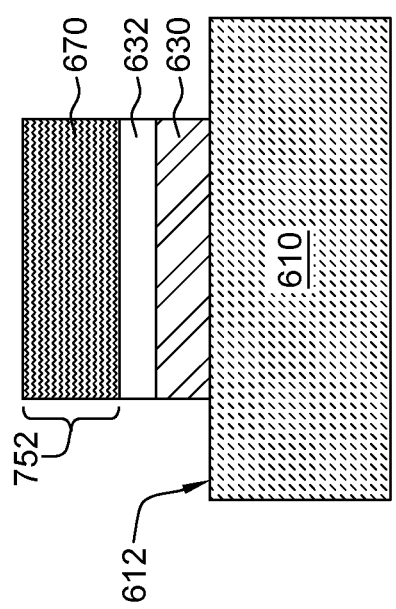

FIGS. 6-8 illustrate cross-sectional views of various pillar pre-processing steps for interconnecting two semiconductor structures. FIGS. 6-8 include structure 610 and structure 620. In an embodiment, structure 610 has a coefficient of thermal expansion (CTE) that is different than a CTE of structure 620. In an alternative embodiment, structure 610 and structure 620 have similar CTEs. In an embodiment, structure 610 is a substrate, such as substrate 100, and structure 620 is a semiconductor die, such as semiconductor die 120. In another embodiment, structure 610 is a substrate, such as substrate 110, and structure 620 is an interposer, such as interposer 220. In another embodiment, structure 610 is an interposer, such as interposer 220, and structure 620 is a semiconductor die, such as semiconductor die 320. In another embodiment, structure 610 is a semiconductor die, such as semiconductor die 120, and structure 620 is an interposer, such as interposer 220. In another embodiment, structure 610 is a semiconductor die, such as semiconductor die 120, and structure 620 is a semiconductor die, such as semiconductor die 320.

FIG. 6 illustrates material compositions formed on structures 610 and 620, respectively, for interconnecting structure 610 with structure 620 in accordance with at least one embodiment of the present invention. In an embodiment, structure 620 may include FEOL, BEOL, or both, with an under-bump-metallurgy (UBM) layer between structure 620 and metal layer 660. As depicted in FIG. 6, a bonding pad 630 is initially formed on a top surface 612 of structure 610. Bonding pad 630 may have a composition of that of bonding pads 130 (depicted in FIGS. 1-5). Although only a single bonding pad 630 is depicted for simplicity's sake, any number of bonding pads 630 may be formed on top surface 612 of structure 610. An optional wetting layer 632 is subsequently formed on the top surface of bonding pad 630. In an embodiment, optional wetting layer 632 is metal, such as gold (Au) or a palladium gold (PdAu) alloy. In another embodiment, optional wetting layer 632 is an organic solderability preservative (OSP). It should be appreciated that a wetting layer improves the wettability of a solder (i.e., the ability of molten solders to wet or spread over a metal surface, such as bonding pad 630). In embodiments where optional wetting layer 632 is not deposited on the top surface of bonding pads 630, solder layer 670 is formed directly onto the top surface of bonding pad 630.

Pillar 650 is formed by initially depositing a metal layer 660, such as copper (Cu), onto a top surface 622 of structure 620. Although only a single pillar 650 is depicted for simplicity's sake, any number of pillars 650 may be formed on top surface 622 of structure 620. For example, pillars 650A-650N (depicted in FIG. 9) are representative of pillar 650. A barrier layer 662 is then deposited onto the top surface of metal layer 660. It should be appreciated that a barrier layer reduces the amount of a metal, such as copper (Cu), that is converted into an intermetallic compound (IMC) during reflow. In an embodiment, barrier layer 662 is formed from a metal, such as Nickel (Ni), a metal alloy thereof, or any generally known metal or metal alloys suitable for forming a barrier layer between copper (Cu) and a solder, such as tin (Sn). A solder layer 664, such as tin (Sn), a tin/silver (SnAg) alloy, or a tin/silver/copper (SnAgCu) alloy, is subsequently deposited onto the top surface of barrier layer 662. Next, a barrier layer 666, such as nickel (Ni), is deposited onto the top surface of solder layer 664, followed by the deposition of a metal layer 668, such as copper (Cu). Lastly, a solder layer 670, such as indium (In), a tin indium (SnIn) alloy, a tin bismuth (SnBi) alloy, or a tin bismuth silver (SnBiAg) alloy is deposited onto the top surface of metal layer 668.

In an embodiment, solder layer 664 is a metal or metal alloy that has a higher melting point than a metal or metal alloy used to form solder layer 670. In an embodiment, solder layer 664 is a solder or solder alloy that has a melting point greater than 200° C., and solder layer 670 is a solder or solder alloy that has a melting point less than 200° C. In an embodiment, solder layer 664 is a solder or solder alloy that has a melting point greater than 200° C., and solder layer 670 is a solder or solder alloy that has a melting point greater than or equal to 110° C. and less than or equal to 180° C.

FIG. 7 illustrates alternative material compositions formed on structures 610 and 620, respectively, for interconnecting structure 610 with structure 620 in accordance with at least one embodiment of the present invention. As depicted in FIG. 7, bonding pad 630 is initially formed on top surface 612 of structure 610. Although only a single bonding pad 630 is depicted for simplicity's sake, any number of bonding pads 630 may be formed on top surface 612 of structure 610. An optional wetting layer 632 is subsequently formed on the top surface of bonding pad 630.

A first portion 752 of a pillar is formed by depositing solder layer 670 onto the top surface of optional wetting layer 632. Although only a single first portion 752 of a pillar is depicted for simplicity's sake, any number of first portions 752 of a plurality of pillars may be formed on top of optional wetting layer 632. For example, first portion 752 as depicted in FIG. 7 is representative of first portion 752 of pillars 750A-750N depicted in FIG. 10. Depending on the fabrication process of first portion 752, if solder layer 670 is not being deposited in a series of processes to bonding pads 630, optional wetting layer 632 may not be required. Accordingly, in embodiments where optional wetting layer 632 is not deposited on the top surface of bonding pads 630, solder layer 670 is formed directly onto the top surface of bonding pads 630.

A second portion 754 of the pillar is formed by initially depositing metal layer 660 onto top surface 622 of structure 620. Although only a single second portion 754 of the pillar is depicted for simplicity's sake, any number of second portions 754 of a plurality of pillars may be formed on top surface 622 of structure 620. For example, second portion 752 as depicted in FIG. 7 is representative of second portion 754 of pillars 750A-750N depicted in FIG. 10. Barrier layer 662 is then deposited onto the top surface of metal layer 660. Solder layer 664 is subsequently deposited onto the top surface of barrier layer 662. Barrier layer 666 is then deposited onto the top surface of solder layer 664, followed by the deposition of metal layer 668 thereon. In an embodiment, and as depicted in in FIG. 7, an optional surface finish layer 669 is deposited onto the top surface of metal layer 668 to prevent oxidation of metal layer 668 and to improve the wettability of solder layer 670 with respect to second structure 754. Optional surface finish layer 669 may be a metal, such as gold (Au) or a palladium gold (PdAu) alloy.

Figure 8A:
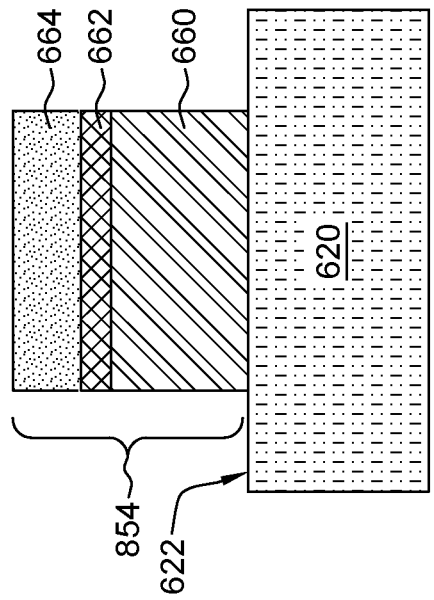
FIG. 8A illustrates alternative material compositions formed on structures 610 and 620, respectively, for interconnecting structure 610 with structure 620 in accordance with at least one embodiment of the present invention.
Figure 8A:
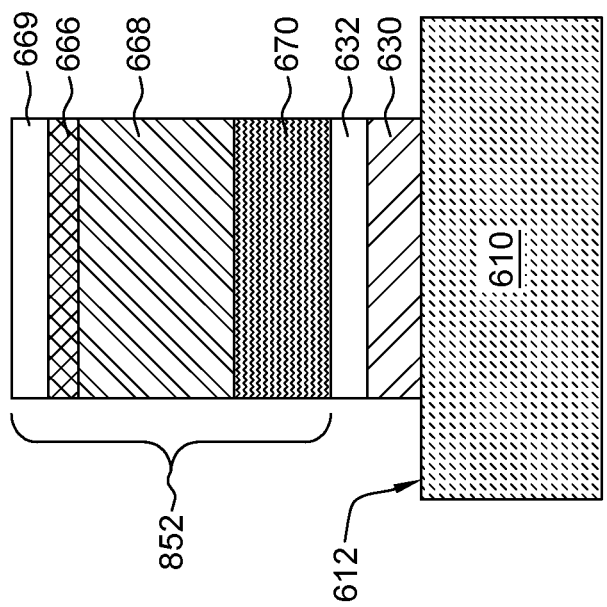

FIG. 8A illustrates alternative material compositions formed on structures 610 and 620, respectively, for interconnecting structure 610 with structure 620 in accordance with at least one embodiment of the present invention. As depicted in FIG. 8A, bonding pads 630 are initially formed on top surface 612 of structure 610. Although only a single bonding pad 630 is depicted for simplicity's sake, any number of bonding pads 630 may be formed on top surface 612 of structure 610. An optional wetting layer 632 is subsequently formed on the top surface of bonding pads 630.

A first portion 852 of a pillar is formed by depositing solder layer 670 onto the top surface of optional wetting layer 632. Although only a single first portion 852 of a pillar is depicted for simplicity's sake, any number of first portions 852 of a plurality of pillars may be formed on top of optional wetting layer 632. For example, first portion 852 as depicted in FIG. 8A is representative of first portion 852 of pillars 850A-850N depicted in FIG. 11. Depending on the fabrication process of first portion 852, if solder layer 670 is not being deposited in a series of processes to bonding pads 630, optional wetting layer 632 may not be required. Accordingly, in embodiments where optional wetting layer 632 is not deposited on the top surface of bonding pads 630, solder layer 670 is formed directly onto the top surface of bonding pads 630. Metal layer 668 is then deposited onto the top surface of solder layer 670, followed by the deposition of barrier layer 666 onto the top surface of metal layer 668. In an embodiment, and as depicted in FIG. 8A, an optional surface finish layer 669 is deposited onto the surface of barrier layer 666 to prevent oxidation of barrier layer 666 and to improve the wettability of solder layer 664 with respect to second portion 854. Optional surface finish layer 669 may be a metal, such as gold (Au) or a palladium gold (PdAu) alloy.

A second portion 854 of the pillar is formed by initially depositing metal layer 660 onto top surface 622 of structure 620. Although only a single second portion 854 of the pillar is depicted for simplicity's sake, any number of second portions 854 of a plurality of pillars may be formed on top surface 622 of structure 620. For example, second portion 854 as depicted in FIG. 8A is representative of second portion 854 of pillars 850A-850N depicted in FIG. 11. Barrier layer 662 is then deposited onto the top surface of metal layer 660, followed by the deposition of solder layer 664 thereon.

Figure 8B:
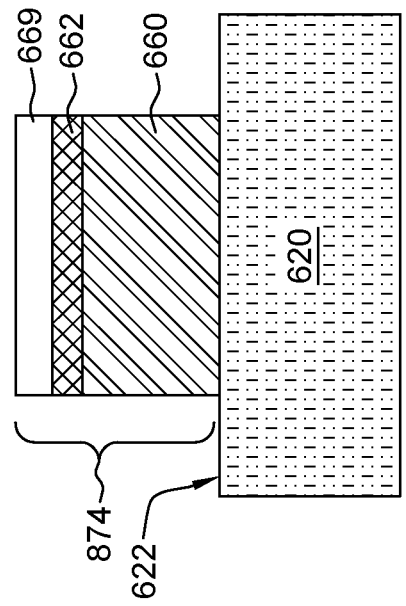
FIG. 8B illustrates alternative material compositions formed on structures 610 and 620, respectively, for interconnecting structure 610 with structure 620 in accordance with at least one embodiment of the present invention.
Figure 8B:
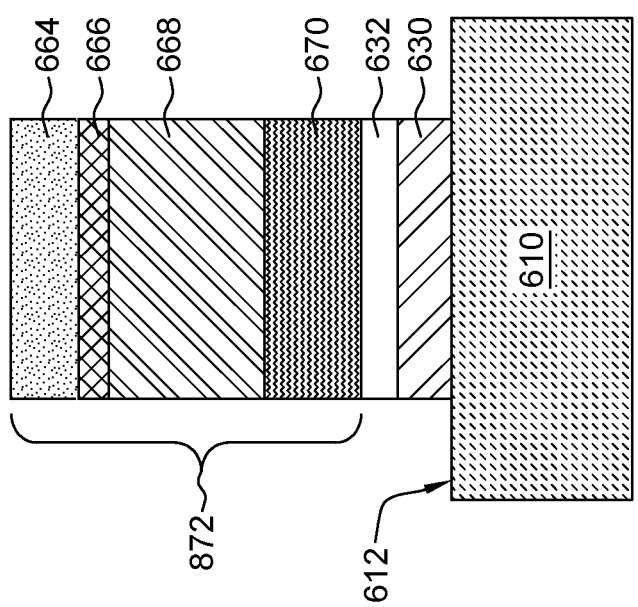

FIG. 8B illustrates alternative material compositions formed on structures 610 and 620, respectively, for interconnecting structure 610 with structure 620 in accordance with at least one embodiment of the present invention. As depicted in FIG. 8B, bonding pads 630 are initially formed on top surface 612 of structure 610. Although only a single bonding pad is depicted for simplicity's sake, any number of bonding pads 630 may be formed on top surface 612 of structure 610. An optional wetting layer 632 is subsequently formed on the top surface of bonding pads 630.

A first portion 872 of a pillar is formed by depositing solder layer 670 onto the top surface of optional wetting layer 632. Although only a single first portion 872 of a pillar is depicted for simplicity's sake, any number of first portions 872 of a plurality of pillars may be formed on top of optional wetting layer 632. For example, first portion 872 as depicted in FIG. 8B is representative of first portion 872 of pillars 870A-870N depicted in FIG. 12. Depending on the fabrication process of first portion 872, if solder layer 670 is not being deposited in a series of processes to bonding pads 630, optional wetting layer may not be required. Accordingly, in embodiments where optional wetting layer 632 is not deposited on the top surface of bonding pads 630, solder layer 670 is formed directly onto the top surface of bonding pads 630. Metal layer 668 is then deposited onto the top surface of solder layer 670, followed by the deposition of barrier layer 666 onto the top surface of metal layer 668. Lastly, solder layer 664 is deposited onto the top surface of barrier layer 666.

A second portion 874 of the pillar is formed by initially depositing metal layer 660 onto top surface 622 of structure 620. Although only a single second portion 874 of the pillar is depicted for simplicity's sake, any number of second portions 874 of a plurality of pillars may be formed on top surface 622 of structure 620. For example, second portion 874 as depicted in FIG. 8B is representative of second portion 874 of pillars 870A-870N depicted in FIG. 11. Barrier layer 662 is then deposited onto the surface of metal layer 660, followed by the deposition of optional surface finish layer 669 to prevent oxidation of barrier layer 662 and to improve the wettability of solder 664 with respect to first portion 872.

FIGS. 9-12 illustrate cross-sectional views of semiconductor structures 900, 1000, 1100, and 1200 formed from the joinder of structures 610 and 620 via pillars 650A-650N, 750A-750N, 850A-850N, and 870A-870N, respectively. It should be appreciated that pillars 650A-650N, 750A-750N, 850A-850N and 870A-870N of FIGS. 9-12, respectively, may be representative of pillars 140 as depicted in FIGS. 1-5. In other words, pillars 650A-650N, 750A-750N, 850A-850N, and 870A-870N can be used to form pillars 140 as depicted in FIGS. 1-5. It should further be appreciated that the various pillar structures as depicted in FIGS. 9-12 allow for the interconnection of structures that may have non-planar surfaces by having a solder layer (e.g., solder layers 664) that is capable of compressing and/or deforming to form a solder elbow (e.g., solder elbows 910, 1010, 1110, and 1210).

Figure 9:
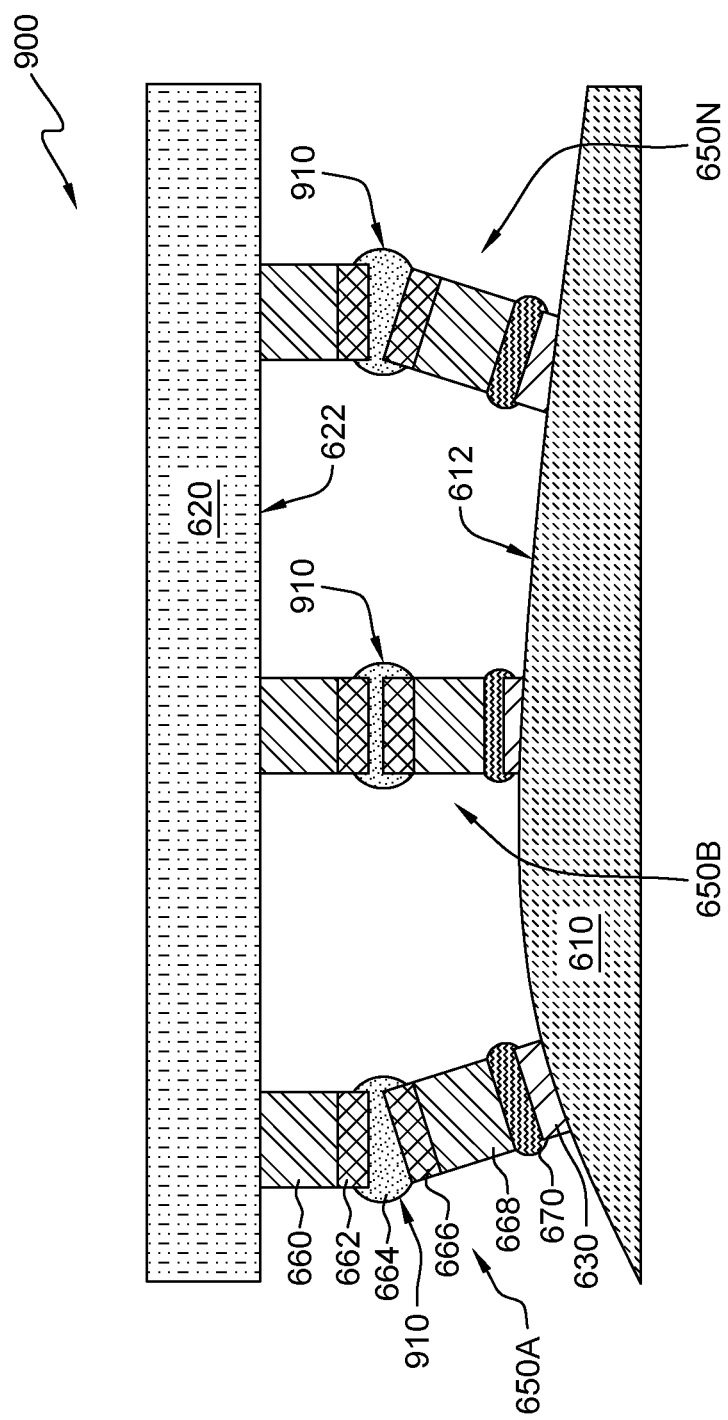
FIG. 9 illustrates a cross-sectional view of a semiconductor structure, generally designated 900, formed from the joinder of structure 610 and 620 as depicted in FIG. 6, in accordance with at least one embodiment of the present invention.

As depicted by FIG. 9, after pillars 650A-650N are formed on top side 622 of structure 620, structure 620 is flipped over or turned upside down, and pillars 650A-650N are attached to bonding pads 630 to form a single, unified semiconductor structure 900. The attachment of pillars 660A-650N to bonding pads 630 can be completed by heating semiconductor structure 900, which results in the reflow of solder layer 670 and the formation of a solder bond or solder joint between solder layer 670 and bonding pads 630. It should be appreciated that although bonding pads 630 react with solder layer 670 to form an intermetallic compound (IMC), even after the reaction, a portion of bonding pads 630 remain on the top surface of structure 610. It should be noted that since an amount of solder layer 670 that is converted into an IMC is greater than an amount of solder layer 664 that is converted into an IMC, solder layer 670 is depicted in FIGS. 9-12 as having a volume that is less than the volume of solder layer 664.

In an embodiment, semiconductor structure 900 is formed by heating structure 900 at a temperature less than the melting point of solder layer 664 and at a temperature equal to or greater than the melting point of solder layer 670. In an embodiment, structure 900 is heated at a temperature less than 200° C. In an embodiment, structure 900 is heated at a temperature greater than or equal to 110° C. and less than or equal to 180° C. It should be appreciated by heating structure 900 at a temperature less than the melting point of solder layer 664, only solder layer 670 will reflow. Accordingly, only a small portion of the higher melting point solder (i.e., solder layer 664) that forms a solder elbow 910 is converted into an intermetallic compound (IMC) since barrier layers 662 and 666 inhibit or otherwise delay the formation of an IMC. This is particularly advantageous in that most of solder layer 664 remains as pure solder after the attachment process. This results in increased flexibility of solder elbow 910, which in turn allows for solder elbow 910 to better absorb mechanical strain caused by differences in coefficient thermal expansion (CTE) between structure 610 and structure 620.

In an embodiment, a percentage of a total solder volume of solder layer 670 that is converted into an intermetallic compound is greater than a percentage of a total solder volume of solder layer 664 that is converted into an intermetallic compound as a result of heating semiconductor structure 900. In another embodiment, a percentage of a total solder volume of first solder layer 664 that is converted into an intermetallic compound as a result of heating semiconductor structure 900 is greater than or equal to zero percent and less than or equal to twenty percent, and a percentage of a total solder volume of solder layer 670 that is converted into an intermetallic compound as a result of heating semiconductor structure 900 is greater than or equal to fifty percent. In another embodiment, depending on the temperature and duration at which structure 900 is heated to, 100% of solder layer 670 is converted into an intermetallic compound.

Figure 10:
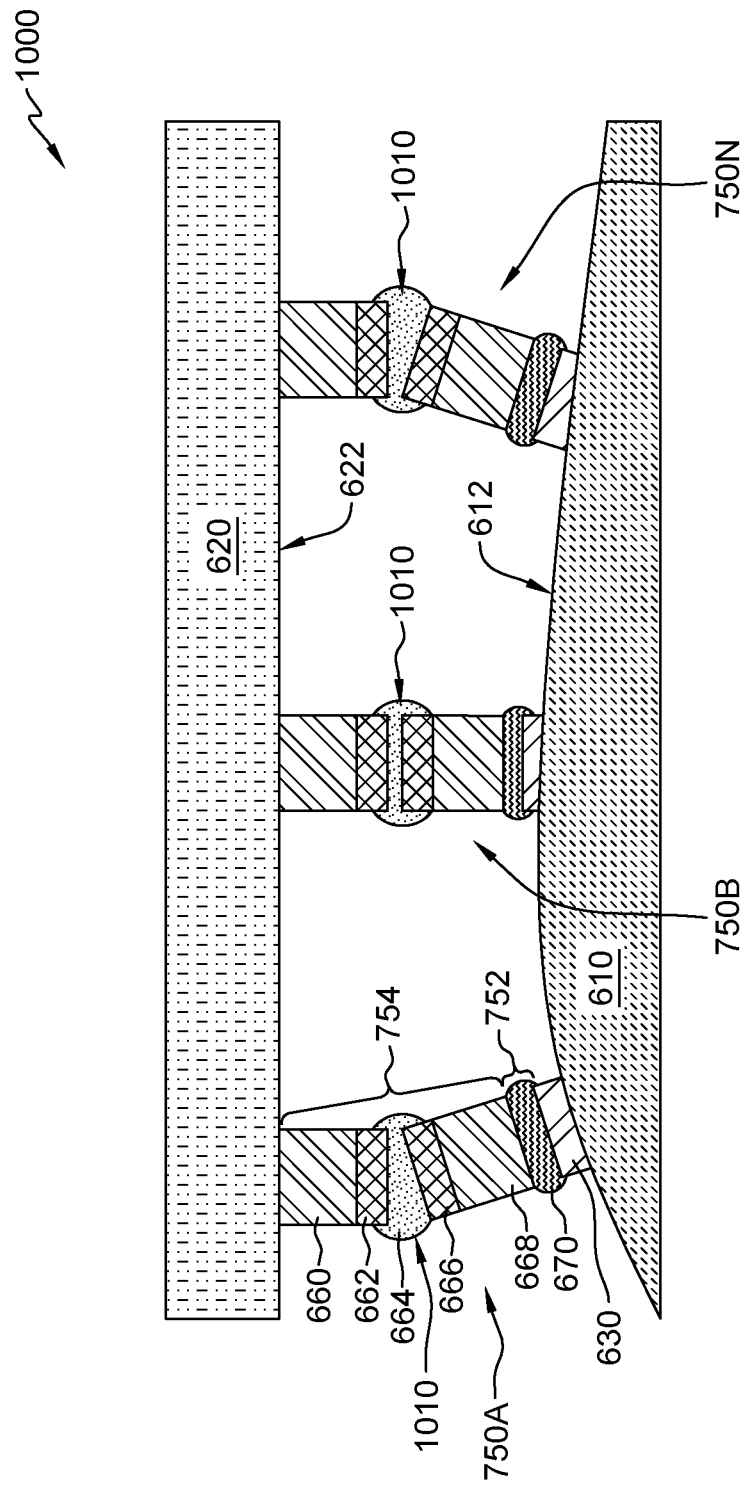
FIG. 10 illustrates a cross-sectional view of a semiconductor structure, generally designated 1000, formed from the joinder of structure 610 and 620 as depicted in FIG. 7, in accordance with at least one embodiment of the present invention.

As depicted by FIG. 10, after first portion 752 of pillars 750A-750N are formed on top side 612 of structure 610, and second portion 754 of pillars 750A-750N are formed on top side 622 of structure 620, structure 620 is flipped over or turned upside down, and second portion 754 of pillars 750A-750N is attached to first portion 752 of pillars 750A-750N to form a single, unified semiconductor structure 1000. The attachment of second portion 754 of pillars 750A-750N to first portion 752 of pillars 750A-750N can be completed by heating semiconductor structure 1000, which results in the reflow solder layer 670 and the formation of a solder bond or solder joint between solder layer 670 and bonding pads 630. It should be appreciated that although bonding pads 630 react with solder layer 670 to form an intermetallic compound (IMC), even after the reaction, a portion of bonding pads 630 remain on the top surface of structure 610.

In an embodiment, semiconductor structure 1000 is formed by heating semiconductor structure 1000 at a temperature less than the melting point of solder layer 664 and at a temperature equal to or greater than the melting point of solder layer 670. In an embodiment, semiconductor structure 1000 is heated at a temperature less than 200° C. In an embodiment, semiconductor structure 1000 is heated at a temperature greater than or equal to 110° C. and less than or equal to 180° C. It should be appreciated by heating semiconductor structure 1000 at a temperature less than the melting point of solder layer 664, only solder layer 670 will reflow. Accordingly, only a small portion of the higher melting point solder (i.e., solder layer 664) that forms a solder elbow 1010 is converted into an intermetallic compound (IMC) since barrier layers 662 and 666 inhibit or otherwise delay the formation of an IMC. This is particularly advantageous in most of solder layer 664 remains as pure solder after the attachment process. This results in increased flexibility of solder elbow 1010, which in turn allows for solder elbow 1010 to better absorb mechanical strain caused by differences in coefficient thermal expansion (CTE) between structure 610 and structure 620.

In an embodiment, a percentage of a total solder volume of solder layer 670 that is converted into an intermetallic compound is greater than a percentage of a total solder volume of solder layer 664 that is converted into an intermetallic compound as a result of heating semiconductor structure 1000. In another embodiment, a percentage of a total solder volume of first solder layer 664 that is converted into an intermetallic compound as a result of heating semiconductor structure 1000 is greater than or equal to zero percent and less than or equal to twenty percent, and a percentage of a total solder volume of solder layer 670 that is converted into an intermetallic compound as a result of heating semiconductor structure 1000 is greater than or equal to fifty percent. In another embodiment, depending on the temperature and duration at which structure 1000 is heated to, 100% of solder layer 670 is converted into an intermetallic compound.

Figure 11:
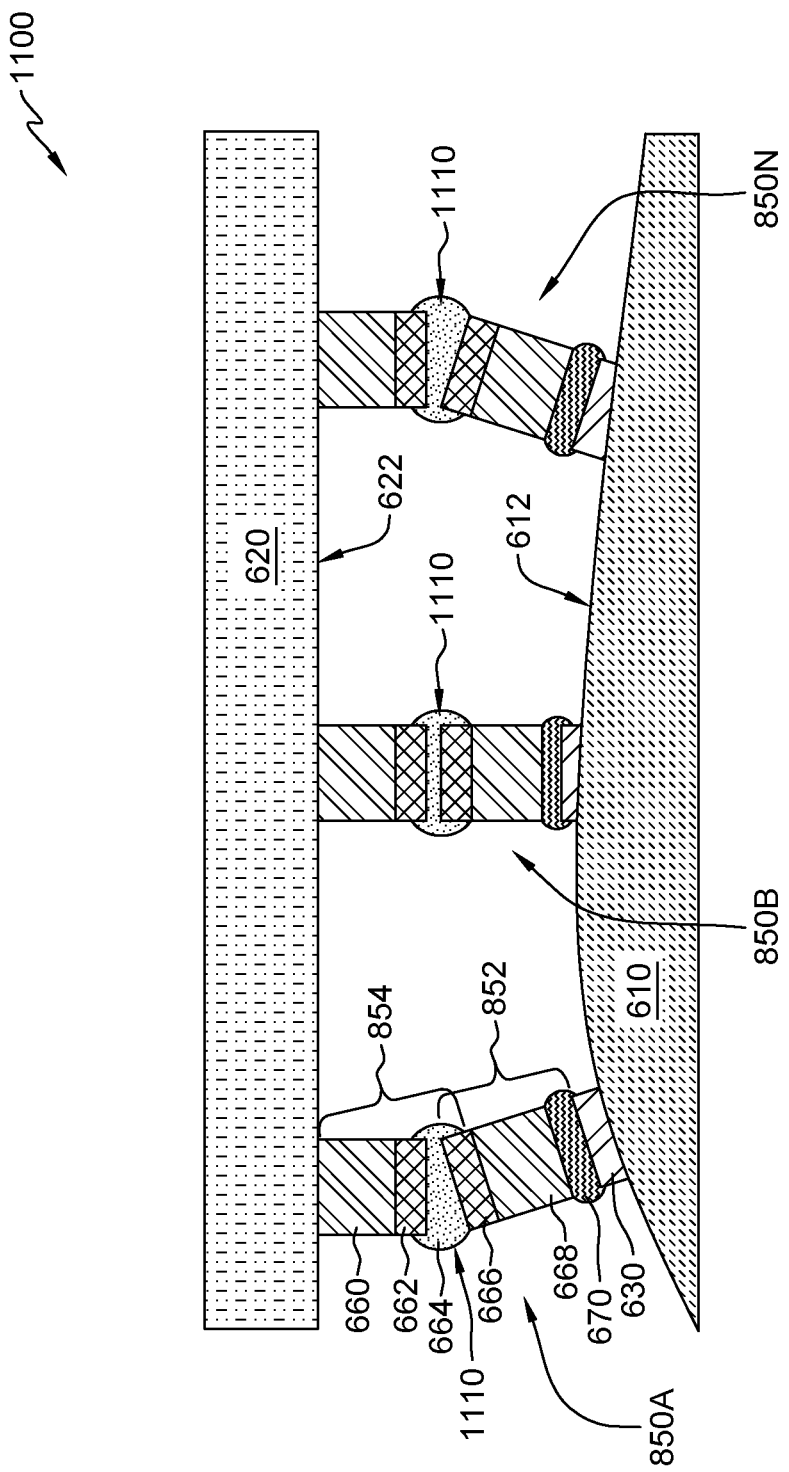
FIG. 11 illustrates a cross-sectional view of a semiconductor structure, generally designated 1100, formed from the joinder of structure 610 and 620 as depicted in FIG. 8A, in accordance with at least one embodiment of the present invention.

As depicted by FIG. 11, after first portion 852 of pillars 850A-850N are formed on top side 612 of structure 610, and second portion 854 of pillars 850A-850N are formed on top side 622 of structure 620, structure 620 is flipped over or turned upside down, and second portion 854 of pillars 850A-850N is attached to first portion 852 of pillars 850A-850N to form a single, unified semiconductor structure 1100. The attachment of second portion 854 of pillars 850A-850N to first portion 852 of pillars 850A-850N can be completed by heating semiconductor structure 1100, which results in the reflow solder layer 670 and the formation of a solder bond or solder joint between solder layer 670 and bonding pads 630. It should be appreciated that although bonding pads 630 react with solder layer 670 to form an intermetallic compound (IMC), even after the reaction, a portion of bonding pads 630 remain on the top surface of structure 610.

In an embodiment, semiconductor structure 1100 is formed by heating semiconductor structure 1100 at a temperature greater than the melting point of solder layer 664 since solder layer 664 is being used to join first portion 852 to second portion 854 of pillars 850A-850N. In an embodiment, semiconductor structure 1100 is heated at a temperature greater than 200° C. It should be appreciated by heating semiconductor structure 1100 at a temperature greater than the melting point of solder layer 664, solder layer 670 will reflow as well. Accordingly, a portion of the higher melting point solder (i.e., solder layer 664) that forms a solder elbow 1110 is converted into an intermetallic compound (IMC) since barrier metals 662 and 666 inhibit the formation of the IMC. This is particularly advantageous in that most of solder layer 664 remains as pure solder after the attachment process. This results in increased flexibility of solder elbow 1100, which in turn allows for solder elbow 1100 to better absorb mechanical strain caused by differences in coefficient thermal expansion (CTE) between structure 610 and structure 620.

In an embodiment, a percentage of a total solder volume of solder layer 670 that is converted into an intermetallic compound is greater than a percentage of a total solder volume of solder layer 664 that is converted into an intermetallic compound as a result of heating semiconductor structure 1100. In another embodiment, a percentage of a total solder volume of first solder layer 664 that is converted into an intermetallic compound as a result of heating semiconductor structure 1100 is greater than or equal to zero percent and less than or equal to twenty percent, and a percentage of a total solder volume of solder layer 670 that is converted into an intermetallic compound as a result of heating semiconductor structure 1100 is greater than or equal to fifty percent. In another embodiment, depending on the temperature and duration at which structure 1100 is heated to, 100% of solder layer 670 is converted into an intermetallic compound.

Figure 12:
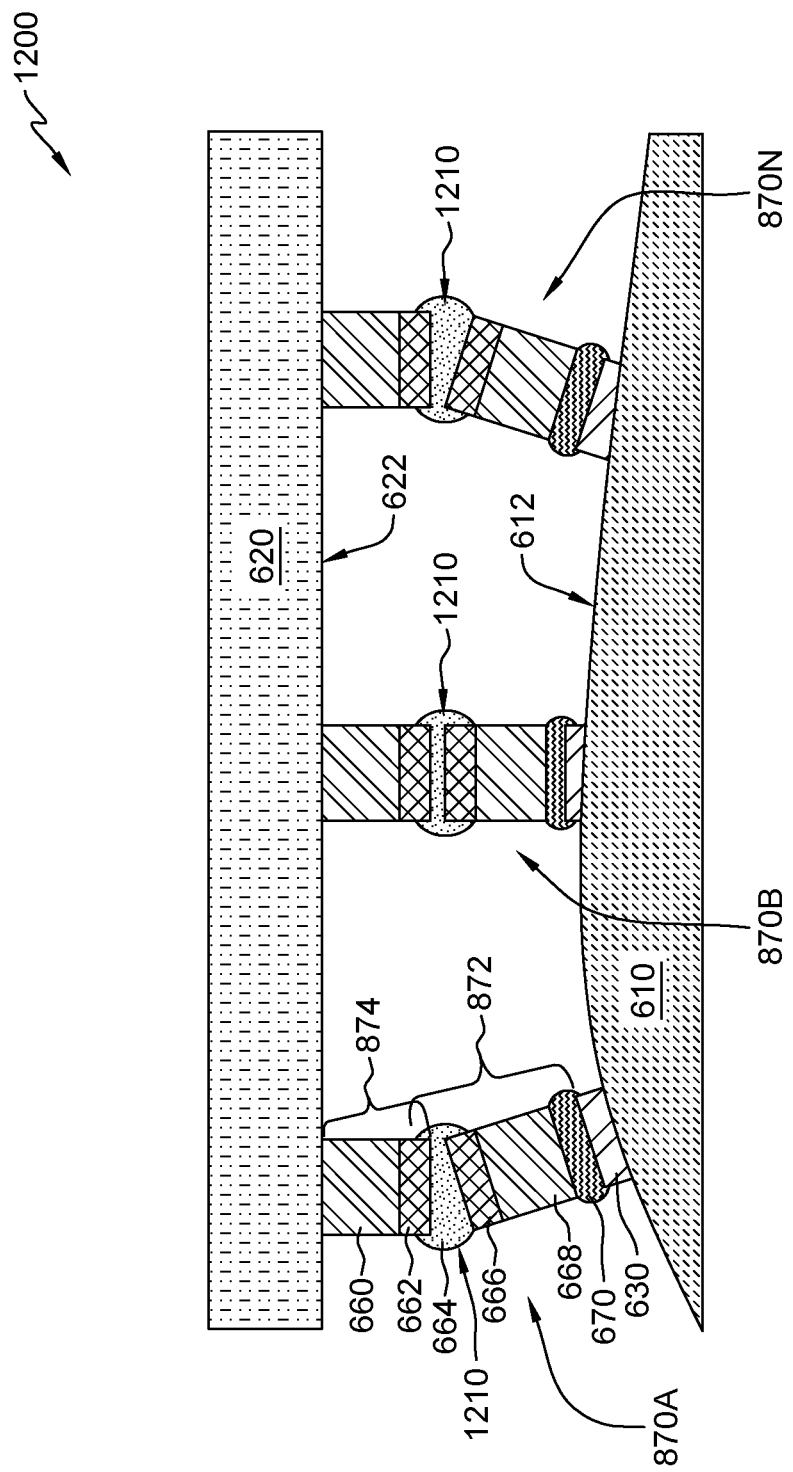
FIG. 12 illustrates a cross-sectional view of a semiconductor structure, generally designated 1200, formed from the joinder of structure 610 and 620 as depicted in FIG. 8B, in accordance with at least one embodiment of the present invention.

As depicted by FIG. 12, after first portion 872 of pillars 870A-870N are formed on top side 612 of structure 610, and second portion 874 of pillars 870A-870N are formed on top side 622 of structure 620, structure 620 is flipped over or turned upside down, and second portion 874 of pillars 870A-870N is attached to first portion 872 of pillars 870A-870N to form a single, unified semiconductor structure 1200. The attachment of second portion 874 of pillars 870A-870N to first portion 872 of pillars 870A-870N can be completed by heating semiconductor structure 1200, which results in the reflow solder layer 670 and the formation of a solder bond or solder joint between solder layer 670 and bonding pads 630. It should be appreciated that although bonding pads 630 react with solder layer 670 to form an intermetallic compound (IMC), even after the reaction, a portion of bonding pads 630 remain on the top surface of structure 610.

In an embodiment, semiconductor structure 1200 is formed by heating semiconductor structure 1200 at a temperature greater than the melting point of solder layer 664 since solder layer 664 is being used to join first portion 872 to second portion 874 of pillars 870A-870N. In an embodiment, semiconductor structure 1200 is heated at a temperature greater than 200° C. It should be appreciated by heating semiconductor structure 1200 at a temperature greater than the melting point of solder layer 664, solder layer 670 will reflow as well. Accordingly, a portion of the higher melting point solder (i.e., solder layer 664) that forms a solder elbow 1210 is converted into an intermetallic compound (IMC) since barrier metals 662 and 666 inhibit the formation of the IMC. This is particularly advantageous in that most of solder layer 664 remains as pure solder after the attachment process. This results in increased flexibility of solder elbow 1210, which in turn allows for solder elbow 1210 to better absorb mechanical strain caused by differences in coefficient thermal expansion (CTE) between structure 610 and structure 620.

In an embodiment, a percentage of a total solder volume of solder layer 670 that is converted into an intermetallic compound is greater than a percentage of a total solder volume of solder layer 664 that is converted into an intermetallic compound as a result of heating semiconductor structure 1200. In another embodiment, a percentage of a total solder volume of first solder layer 664 that is converted into an intermetallic compound as a result of heating semiconductor structure 1200 is greater than or equal to zero percent and less than or equal to twenty percent, and a percentage of a total solder volume of solder layer 670 that is converted into an intermetallic compound as a result of heating semiconductor structure 1200 is greater than or equal to fifty percent. In another embodiment, depending on the temperature and duration at which structure 1200 is heated to, 100% of solder layer 670 is converted into an intermetallic compound.

According to one embodiment of the present invention, a method of interconnecting a first semiconductor structure with a second semiconductor structure in accordance with at least one embodiment of the present invention is disclosed. The method includes: forming a plurality of pillars on a surface of the first semiconductor structure, wherein each pillar in the plurality of pillars is formed based, at least in part, on: depositing a first metal layer onto a surface of the first semiconductor structure, depositing a first solder layer onto the first metal layer, depositing a second metal layer onto the first solder layer, and depositing a second solder layer onto the second metal layer, wherein the second solder layer has a lower melting point than a melting point of the first solder layer; and interconnecting the first semiconductor structure with the second semiconductor structure by attaching the second solder layer of each pillar in the plurality of pillars to a respective bonding pad of a plurality of bonding pads located on a surface of the second semiconductor structure.

The method according to Clause 1, further comprising: forming a first barrier layer between the first metal layer and the first solder layer; and forming a second barrier layer between the first solder layer and the second metal layer.

The method according to Clause 1, wherein attaching the second solder layer of a pillar to a bonding pad further includes reflowing only the second solder layer to form a solder joint between the second solder layer and the bonding pad.

The method according to Clause 1, wherein: the melting point of the first solder layer is greater than 200° C.; and the melting point of the second solder layer is less than 200° C.

The method according to Clause 1, wherein: the first solder layer is formed from Sn or an Sn alloy; and the second solder layer is formed from indium (In), a SnBi alloy, a SnIn alloy, or an SnBiAg alloy.

The method according to Clause 1, wherein: the first metal layer and the second metal layer are Cu; and the plurality of bonding pads are formed from at least one material selected from the group consisting of Au, Pd, Cu, Ni, and alloys thereof.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A method of interconnecting a first semiconductor structure with a second semiconductor structure, the method comprising:
    forming a plurality of pillars on a surface of the first semiconductor structure, wherein each pillar in the plurality of pillars is formed by:
        depositing a first metal layer onto a surface of the first semiconductor structure;
        depositing a first solder layer onto the first metal layer;
        depositing a second metal layer onto the first solder layer; and
        depositing a second solder layer onto the second metal layer inverting the first semiconductor structure having the plurality of pillars formed on the surface of the first semiconductor; and
    interconnecting the inverted first semiconductor structure with the second semiconductor structure by attaching the second solder layer of each pillar in the plurality of pillars to a respective bonding pad of a plurality of bonding pads located on a top surface of the second semiconductor structure, wherein the second solder layer of each pillar in the plurality of pillars attached to the respective bonding pad of the plurality of bonding pads located on the top surface of the second semiconductor structure has a lower melting point than a melting point of the first solder layer formed between the first metal layer and the second metal layer of each pillar in the plurality of pillars.

2. The method of claim 1, further comprising:
    forming a first barrier layer between the first metal layer and the first solder layer; and
    forming a second barrier layer between the first solder layer and the second metal layer.

3. The method of claim 1, wherein attaching the second solder layer of a pillar to a bonding pad further includes reflowing only the second solder layer to form a solder joint between the second solder layer and the bonding pad.

4. The method of claim 1, wherein:
    the melting point of the first solder layer is greater than 200° C.; and
    the melting point of the second solder layer is less than 200° C.

5. The method of claim 1, wherein:
    the first solder layer is formed from Sn, a SnAg alloy, or a SnAgCu alloy; and
    the second solder layer is formed from indium, a SnBi alloy, a SnIn alloy, or a SnBiAg alloy.

6. The method of claim 1, wherein:
    the first metal layer and the second metal layer are Cu; and
    the plurality of bonding pads are formed from at least one material selected from the group consisting of Au, Pd, Cu, Ni, and alloys thereof.

7. A semiconductor device, comprising:
    a first semiconductor structure;
    a second semiconductor structure located below the first semiconductor structure; and
    a plurality of pillars interconnecting the first semiconductor structure and the second semiconductor structure, wherein the plurality of pillars include:
        a first solder layer located between a first metal layer and a second metal layer; and
        a second solder layer attached to a bonding pad formed on a surface of the second semiconductor structure, wherein a melting point of the first solder layer located between the first metal layer and the second metal layer is greater than a melting pointing of the second solder layer attached to the bonding pad formed on the surface of the second semiconductor structure.

8. The semiconductor device of claim 7, wherein:
    the first solder layer is formed from Sn, a SnAg alloy, or a SnAgCu alloy; and
    the second solder layer is formed from indium, a SnBi alloy, a SnIn alloy, or a SnBiAg alloy.

9. The semiconductor structure of claim 7, wherein after heating the first semiconductor structure, the second semiconductor structure, and the plurality of pillars interconnecting the first semiconductor structure and the second semiconductor structure, the first solder layer located between the first metal layer and the second metal layer forms a solder elbow and the second solder layer attached to the bonding pad formed on the surface of the second semiconductor structure forms a solder joint.

10. The semiconductor device of claim 7, wherein:
the first metal layer and the second metal layer are formed from Cu; and
the bonding pad is formed from at least one material selected from the group consisting of Au, Pd, Cu, Ni, and alloys thereof.

11. The semiconductor device of claim 7, further comprising:
a first barrier layer located between the first metal layer and the first solder layer; and
a second barrier layer located between the first solder layer and the second metal layer.

12. The semiconductor device of claim 11, wherein the first barrier layer and the second barrier layer are formed from Ni.

13. The semiconductor device of claim 7, wherein:
a percentage of a total solder volume of the second solder layer that has been converted into an intermetallic compound is greater than a percentage of a total solder volume of the first solder layer that has been converted into an intermetallic compound.

14. The semiconductor device of claim 7, wherein:
a percentage of a total solder volume of the first solder layer that has been converted into an intermetallic compound is greater than or equal to zero percent and less than or equal to twenty percent; and
a percentage of a total solder volume of the second solder layer that has been converted into an intermetallic compound is greater than or equal to fifty percent.

15. The semiconductor device of claim 7, wherein:
a percentage of a total volume of the second solder layer that has been converted into an intermetallic compound is one hundred percent.

16. The semiconductor device of claim 7, wherein the first solder layer is a metal or metal alloy that has a melting point greater than 200° C. and the second solder layer is a metal or metal alloy that has a melting point less than 200° C.

17. The semiconductor device of claim 7, wherein:
the first solder layer is a metal or metal alloy, and the melting point of the first solder layer is greater than 200° C.; and
the second solder layer is a metal or metal alloy, and the melting point of the second solder layer is greater than or equal to 110° C. and less than or equal to 180° C.

18. The semiconductor device of claim 7, wherein a coefficient of thermal conductivity of the first semiconductor structure is different than a coefficient of thermal conductivity of the second semiconductor structure.

19. A pillar structure used to interconnect a first semiconductor structure with a second semiconductor structure, the pillar structure comprising:
a first solder layer located between a first metal layer and a second metal layer, wherein the first solder layer is a solder elbow; and
a second solder layer formed on the second metal layer, wherein the second solder layer is a solder joint, and further wherein:
a melting point of the first solder layer located between the first metal layer and the second metal layer is greater than a melting pointing of the second solder layer formed on the second metal layer.

* * * * *